(12) United States Patent
Chao et al.

(10) Patent No.: US 8,891,241 B2
(45) Date of Patent: Nov. 18, 2014

(54) ELECTRONIC ASSEMBLY

(75) Inventors: Shih-Chieh Chao, Taipei (TW);
Chih-Wen Huang, Taipei (TW)

(73) Assignee: Tatung Company, Taipei (TW)

( * ) Notice: Subject to any disclaimer, the term of this patent is extended or adjusted under 35 U.S.C. 154(b) by 294 days.

(21) Appl. No.: 13/615,638

(22) Filed: Sep. 14, 2012

(65) Prior Publication Data
US 2013/0176683 A1    Jul. 11, 2013

(30) Foreign Application Priority Data

Jan. 6, 2012 (TW) .............................. 101100649 A

(51) Int. Cl.
*H05K 7/20* (2006.01)
*H05K 9/00* (2006.01)

(52) U.S. Cl.
USPC ........... 361/704; 361/709; 361/719; 361/816; 361/818; 257/659; 257/706; 257/722

(58) Field of Classification Search
USPC ............. 361/679.54, 704, 709, 818; 165/185; 257/659, 706, 722
See application file for complete search history.

(56) References Cited

U.S. PATENT DOCUMENTS

| | | | |
|---|---|---|---|
| 5,541,811 A * | 7/1996 | Henningsson et al. | 361/704 |
| 6,205,026 B1 * | 3/2001 | Wong et al. | 361/704 |
| 6,430,043 B1 * | 8/2002 | Osburn | 361/679.54 |
| 7,608,326 B2 * | 10/2009 | Johnson | 428/328 |
| 7,842,381 B2 * | 11/2010 | Johnson | 428/323 |
| 7,924,568 B2 * | 4/2011 | Ho et al. | 361/710 |
| 2001/0033476 A1 * | 10/2001 | Dibene et al. | 361/702 |
| 2007/0086170 A1 * | 4/2007 | Liang | 361/719 |
| 2011/0255247 A1 * | 10/2011 | Chu | 361/709 |

FOREIGN PATENT DOCUMENTS

TW    M369018    11/2009
WO    WO 2008107991 A1 *    9/2008    ............... H05K 9/00

* cited by examiner

*Primary Examiner* — Robert J Hoffberg
(74) *Attorney, Agent, or Firm* — Jianq Chyun IP Office

(57) ABSTRACT

An electronic assembly includes a heat generating element, a heat dissipation fin set and a filter circuit board. The filter circuit board is disposed between the heat generating element and the heat dissipation fin set. The filter circuit board includes a metal layer, an electromagnetic band gap structure layer, an insulation layer disposed between the metal layer and the electromagnetic band gap structure layer and plural first thermal vias. The heat dissipation fin set is disposed on the heat generating element and directly contacts the metal layer. The electromagnetic band gap structure layer has plural conductive patterns arranged in the same pitches. The heat generating element directly contacts at least one of the conductive patterns. The first thermal vias pass through the insulation layer, the metal layer and the conductive patterns. Two ends of each first thermal via respectively connect the metal layer and the corresponding conductive pattern.

10 Claims, 4 Drawing Sheets

ELECTRONIC ASSEMBLY

CROSS-REFERENCE TO RELATED APPLICATION

This application claims the priority benefit of taiwan application serial no. 101100649, filed on Jan. 6, 2012. The entirety of the above-mentioned patent application is hereby incorporated by reference herein and made a part of this specification.

BACKGROUND OF THE INVENTION

1. Field of the Invention

The present invention generally relates to an electronic assembly, in particular, to an electronic assembly capable of lowering electromagnetic interference.

2. Description of Related Art

In recent years, with the upgrading of the integration of an Integrated Circuit (IC), a Central Processing Unit (CPU) with a high computing speed and a high frequency IC have been widely applied in various types of electronic products. However, such electronic devices have high power consumption. Therefore, to maintain a normal working temperature, a heat dissipation fin set is usually equipped to lower the temperature of the electronic devices.

Generally speaking, the heat dissipation fin set is directly disposed on a chip, and each heat dissipation fin of the heat dissipation fin set may be regarded as a monopole antenna. A conventional heat dissipation fin set is not connected to a grounding layer of a printed circuit board below the chip, and thus could be regarded as a floating metal. In this way, noises are generated by the chip and are further coupled to the heat dissipation fin set. When the frequency of the noises is close to a resonant frequency of the heat dissipation fin set, the heat dissipation fin set becomes a good antenna structure, which not only has strong electromagnetic radiations, but also can be coupled to other external circuits. Therefore, interference is caused to the whole electronic product.

In order to solve the above problem, a method is provided by the prior art that, the heat dissipation fin set is electrically connected to the grounding layer of the printed circuit board, so that a potential difference between the heat dissipation fin set and the grounding layer is lowered, and the electromagnetic radiations are reduced. However, the circuit layout on the periphery of the chip is dense, so it is not easy to find appropriate grounding points on the printed circuit board. In addition, if noises of the grounding point are excessively high, it is even easier for the noises to be coupled to the heat dissipation fin set, thereby enhancing the effect of the electromagnetic radiations.

Another conventional method is to add a metal shielding cover above the heat dissipation fin set to reduce the electromagnetic interference. The main function of the heat dissipation fin set is to conduct the heat generated by the chip out. However, when the heat dissipation fin set is shielded by the metal shielding cover, the heat dissipation effect of the heat dissipation fin set may be largely reduced. If an opening is disposed on the metal shielding cover to expose a part of the heat dissipation fin set in order to solve the problem of heat dissipation, the shielding effect of the metal shielding cover is also lowered.

SUMMARY OF THE INVENTION

Accordingly, the present invention is directed to an electronic assembly, capable of effectively lowering an electromagnetic coupling effect between a heat generating element and a heat dissipation fin set.

The present invention provides an electronic assembly, which includes a heat generating element, a heat dissipation fin set and a filter circuit board. The heat dissipation fin set is disposed on the heat generating element. The filter circuit board is disposed between the heat generating element and the heat dissipation fin set. The filter circuit board includes a metal layer, an electromagnetic band gap structure layer, an insulation layer and a plurality of first thermal vias. The heat dissipation fin set directly contacts the metal layer of the filter circuit board. The electromagnetic band gap structure layer has a plurality of conductive patterns arranged in the same pitches. The heat generating element directly contacts at least one of the conductive patterns. The insulation layer is disposed between the metal layer and the electromagnetic band gap structure layer. The first thermal vias pass through the insulation layer, the metal layer and the conductive patterns of the electromagnetic band gap structure layer. Two ends of each first thermal via respectively connect the metal layer and the corresponding conductive pattern.

In an embodiment of the present invention, the heat generating element includes a chip.

In an embodiment of the present invention, the insulation layer has an upper surface and a lower surface opposite to each other. The metal layer completely covers the upper surface. The conductive patterns of the electromagnetic band gap structure layer expose a part of the lower surface.

In an embodiment of the present invention, the conductive patterns are embedded in the lower surface of the insulation layer, and a surface of each conductive pattern is aligned with the lower surface of the insulation layer.

In an embodiment of the present invention, the conductive patterns are located on the lower surface of the insulation layer.

In an embodiment of the present invention, the electronic assembly further includes a plurality of second thermal vias, passing through the insulation layer, the metal layer and the conductive patterns directly contacting the heat generating element. The second thermal vias connect the metal layer and the conductive patterns directly contacting the heat generating element.

In an embodiment of the present invention, the conductive patterns have the same size or different sizes.

In an embodiment of the present invention, the shape of the conductive patterns is rectangular, hexagonal, or circular.

In an embodiment of the present invention, the electromagnetic band gap structure layer is doped with ferromagnetic powders or ferroelectric substances.

In an embodiment of the present invention, the material of the conductive patterns includes metal.

In an embodiment of the present invention, the material of the insulation layer includes ceramics or a high-thermal-conductive insulation material.

Based on the above, in the present invention, a filter circuit board having an electromagnetic band gap structure layer is disposed between a heat generating element and a heat dissipation fin set. Thereby, the electromagnetic coupling effect between the heat generating element and the heat dissipation fin set is effectively lowered, noises are inhibited from being coupled to the heat dissipation fin set, and electromagnetic radiations generated by the heat dissipation fin set are reduced. Additionally, the original heat dissipation effect of the heat dissipation fin set for the heat generating element is not affected. Therefore, the electronic assembly of the present invention achieves a good heat dissipation effect, the electromagnetic noises are effectively inhibited, and the electromagnetic interference is lowered.

In order to make the aforementioned features and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
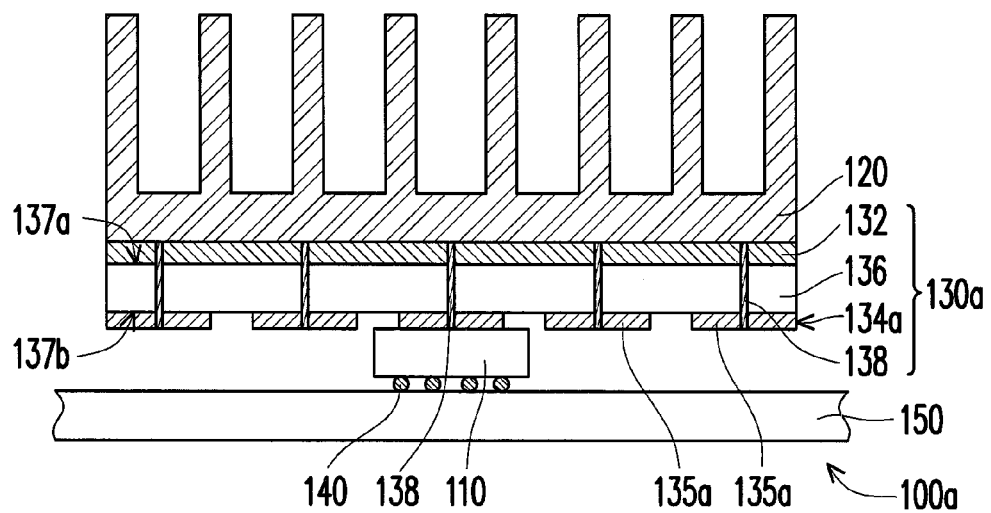
FIG. 1A is a schematic sectional view of an electronic assembly according to an embodiment of the present invention.

Reference will now be made in detail to the embodiments of the present invention, examples of which are illustrated in the accompanying drawings. Wherever possible, the same reference numbers are used in the drawings and the description to refer to the same or like parts.

Figure 1B:
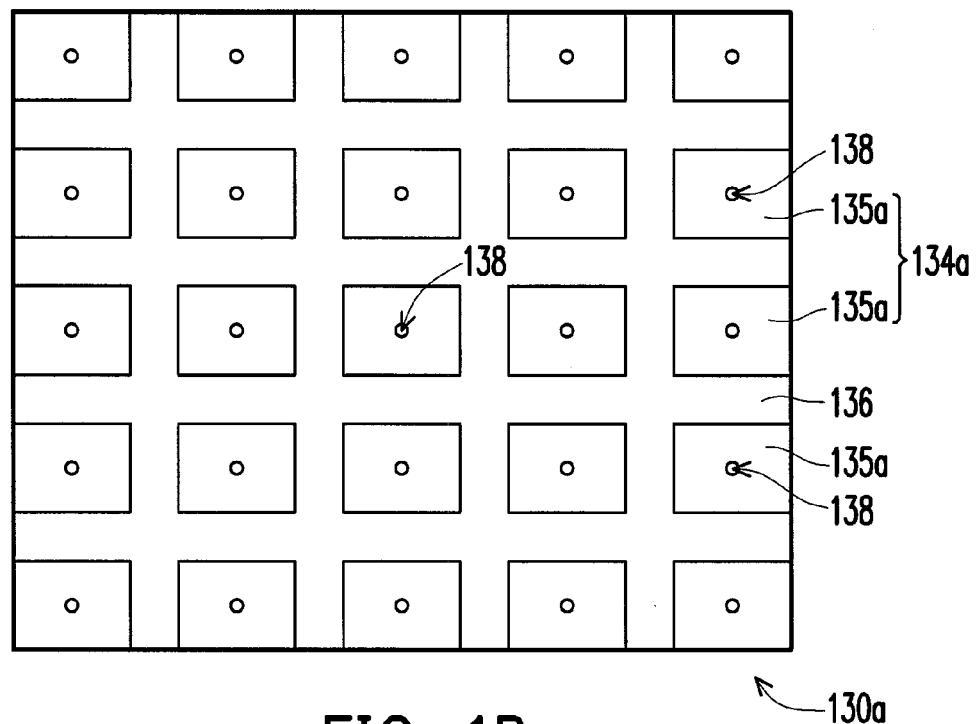
FIG. 1B is a schematic bottom view of a filter circuit board in FIG. 1A.

FIG. 1A is a schematic sectional view of an electronic assembly according to an embodiment of the present invention. FIG. 1B is a schematic bottom view of a filter circuit board in FIG. 1A. Referring to FIG. 1A and FIG. 1B at the same time, in this embodiment, an electronic assembly 100a includes a heat generating element 110, a heat dissipation fin set 120 and a filter circuit board 130a. The heat dissipation fin set 120 is disposed on the heat generating element 110. The filter circuit board 130a is disposed between the heat generating element 110 and the heat dissipation fin set 120. Here, the heat generating element 110 is, for example, a chip, and the present invention is not limited herein. For example, the chip may be an IC chip, including a single chip such as a graphic chip, a memory chip and a semiconductor chip, or a chip module. An edge of the heat dissipation fin set 120 is, for example, aligned with an edge of the filter circuit board 130a, and the present invention is not limited herein.

Specifically, the filter circuit board 130a includes a metal layer 132, an electromagnetic band gap structure layer 134a, an insulation layer 136 and a plurality of first thermal vias 138. The metal layer 132, the electromagnetic band gap structure layer 134a and the insulation layer 136 may be regarded as a capacitor structure. The heat dissipation fin set 120 directly contacts the metal layer 132 of the filter circuit board 130a. The electromagnetic band gap structure layer 134a has a plurality of conductive patterns 135a with the same size and arranged in the same pitches. The conductive patterns 135a arranged in the same pitches may form a two-dimensional periodic structure. Here, the shape of the conductive patterns 135a is, for example, rectangular, and the material of the conductive patterns 135a is, for example, metal. The material of the insulation layer 136 is, for example, ceramics or a high-thermal-conductive insulation material. It should be noted that, in order to effectively inhibit the transmission of electromagnetic waves, the filter circuit board 130a of this embodiment is further doped with ferromagnetic powders or ferroelectric substances.

The heat generating element 110 directly contacts at least one of the conductive patterns 135a. As shown in FIG. 1A, in this embodiment, it is demonstrated that the heat generating element 110 merely contacts one conductive pattern 135a, and the present invention is not limited herein. That is to say, the heat generating element 110 may contact different numbers of conductive patterns 135a based on the size of the conductive pattern 135a. The insulation layer 136 is disposed between the metal layer 132 and the electromagnetic band gap structure layer 134a, and has an upper surface 137a and a lower surface 137b opposite to each other. The metal layer 132 completely covers the upper surface 137a of the insulation layer 136. The conductive patterns 135a of the electromagnetic band gap structure layer 134a are located on the lower surface 137b of the insulation layer 136, and expose a part of the lower surface 137b. The first thermal vias 138 pass through the insulation layer 136, the metal layer 132 and the conductive patterns 135a of the electromagnetic band gap structure layer 134a. Two ends of each first thermal via 138 respectively connect the metal layer 132 and the corresponding conductive pattern 135a.

In particular, the size of the conductive pattern 135a of this embodiment has an inverse proportion to inhibiting electromagnetic wave noises in a specific frequency range. That is, when the size of the conductive pattern 135a is small, plenty of conductive patterns 135a may be disposed on the insulation layer 136 with a single size. At this time, the electromagnetic band gap structure layer 134a may inhibit electromagnetic wave noises in a higher frequency range. On the contrary, when the size of the conductive pattern 135a is large, a few conductive patterns 135a may be disposed on the insulation layer 136 with a single size. At this time, the electromagnetic band gap structure layer 134a may inhibit electromagnetic wave noises in a low frequency range. Here, the size of the conductive pattern 135a is not limited. Persons skilled in the art may design an appropriate size for the conductive pattern 135a according to actual requirements with reference to the description of the aforementioned embodiment to achieve a required technical effect. In addition, when the heat generating element 110 in operation generates electromagnetic radiations, since the filter circuit board 130a is disposed between the heat generating element 110 and the heat dissipation fin set 120, the filter circuit board 130a may effectively inhibit electromagnetic coupling generated by the heat generating element 110, so that the electromagnetic coupling is prevented from being transmitted in the filter circuit board 130a. In this way, the electromagnetic radiations generated by the heat generating element 110 are incapable of entering the heat dissipation fin set 120. Thereby, the heat dissipation fin set 120 is effectively inhibited from generating electromagnetic radiations. Apart from this, in order to increase the applicability of the electronic assembly 100a, the electronic assembly 100a further includes a plurality of conductive bumps 140 disposed on the heat generating element 110. The heat generating element 110 is electrically connected to an external circuit 150 through the conductive bumps 140.

In this embodiment, the filter circuit board 130a having the electromagnetic band gap structure layer 134a is disposed between the heat generating element 110 and the heat dissipation fin set 120. Therefore, the electromagnetic coupling between the heat generating element 110 and the heat dissipation fin set 120 is effectively lowered, noises are inhibited from being coupled to the heat dissipation fin set 120, and electromagnetic radiations generated by the heat dissipation fin set 120 are reduced. In addition, the filter circuit board 130a of this embodiment has a design of the first thermal vias 138. Therefore, a connection area between the metal layer 132 and the conductive patterns 135a is increased, the heat dissipation efficiency of the filter circuit board 130a is effectively increased, and the heat dissipation effect of the whole electronic assembly 100a is enhanced. Therefore, the original heat dissipation effect of the heat dissipation fin set 120 for the heat generating element 110 is not affected. In short, the electronic assembly 100a of this embodiment achieves a good heat dissipation effect, the electromagnetic wave noises in a specific frequency range are effectively inhibited, and the electromagnetic interference is lowered.

It should be noted that, the embodiments below continue to use the element numbers and partial contents of the aforementioned embodiment. The same number is used to indicate the same or similar element, and the description of the same technical content is omitted. Reference can be made to the aforementioned embodiment for the description of the omitted part, which is not described again in the embodiments below.

Figure 2A:
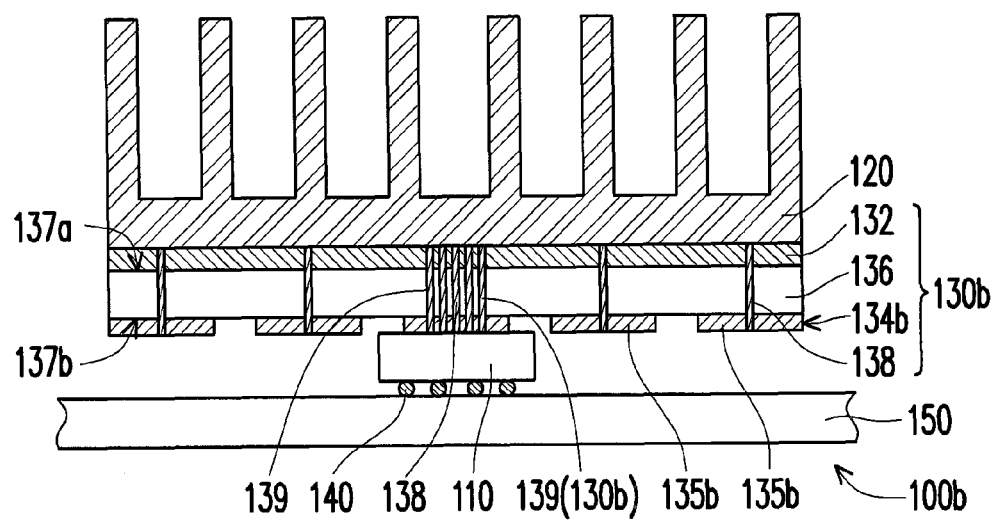
FIG. 2A is a schematic sectional view of an electronic assembly according to another embodiment of the present invention.
Figure 2B:
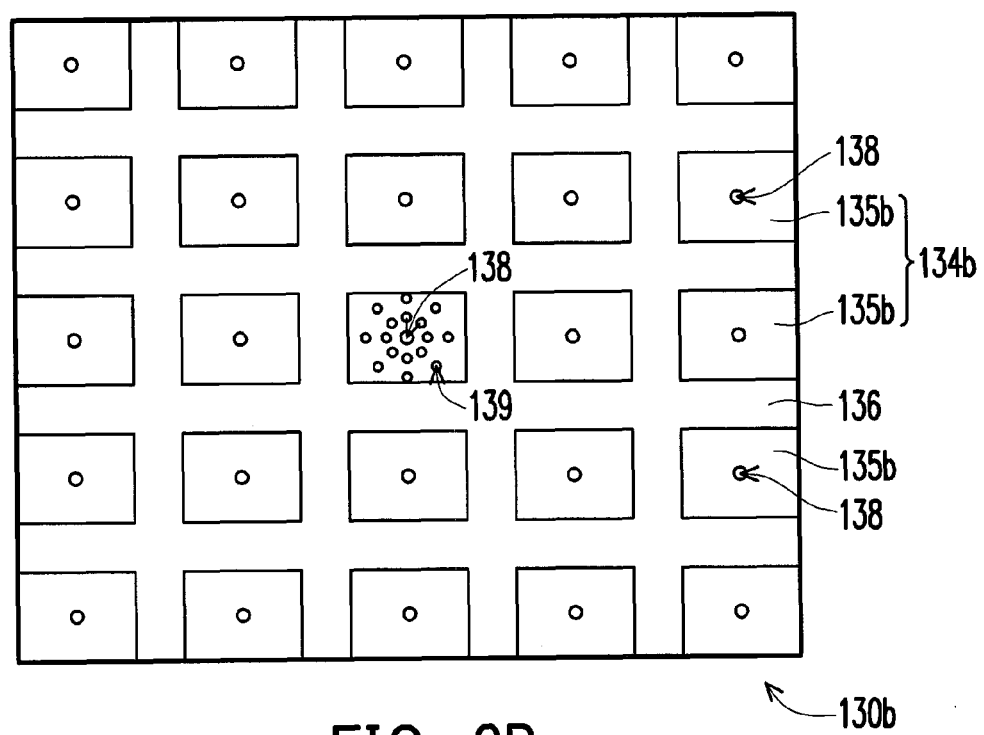
FIG. 2B is a schematic bottom view of a filter circuit board in FIG. 2A.

FIG. 2A is a schematic sectional view of an electronic assembly according to another embodiment of the present invention. FIG. 2B is a schematic bottom view of a filter circuit board in FIG. 2A. Referring to FIG. 2A and FIG. 2B at the same time, an electronic assembly 100b of this embodiment is similar to the electronic assembly 100a in FIG. 1A, and the main difference of the two merely lies in that, the electronic assembly 100b of this embodiment further includes a plurality of second thermal vias 139. The second thermal vias 139 pass through an insulation layer 136, a metal layer 132 and conductive patterns 135b directly contacting the heat generating element 110. The second thermal vias 139 connect the metal layer 132 and the conductive patterns 135b directly contacting the heat generating element 110.

The filter circuit board 130b of this embodiment has a design of the first thermal vias 138 and the second thermal vias 139. The second thermal vias 139 connect the metal layer 132 and the conductive patterns 135b directly contacting the heat generating element 110. Therefore, when heat generated by the heat generating element 110 is transmitted to the filter circuit board 130b, a connection area between the metal layer 132 and the conductive patterns 135b is increased, the heat dissipation efficiency of the filter circuit board 130b for the heat generating element 110 is effectively increased, and the heat dissipation effect of the whole electronic assembly 100b is enhanced.

Figure 3:
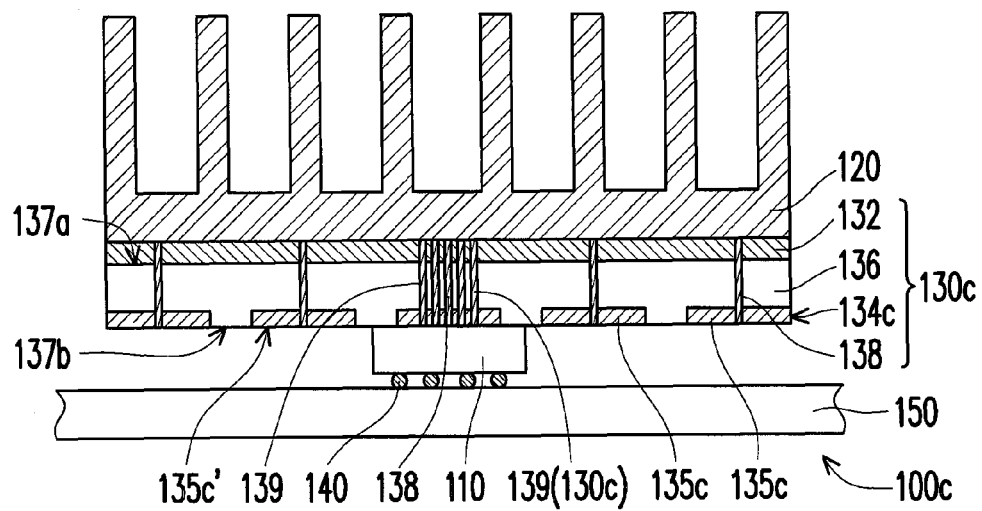
FIG. 3 is a schematic sectional view of an electronic assembly according to another embodiment of the present invention.

FIG. 3 is a schematic sectional view of an electronic assembly according to another embodiment of the present invention. Referring to FIG. 3, an electronic assembly 100c of this embodiment is similar to the electronic assembly 100a in FIG. 1A, and the main difference of the two merely lies in that, conductive patterns 135c of an electromagnetic band gap structure layer 134c of a filter circuit board 130c in this embodiment are embedded in a lower surface 137b of an insulation layer 136, and a surface 135c' of each conductive pattern 135c is substantially aligned with the lower surface 137b of the insulation layer 136. In this way, the volume of the whole electronic assembly 100c is effectively reduced, so as to comply with the current development trend of thin products.

Figure 4:
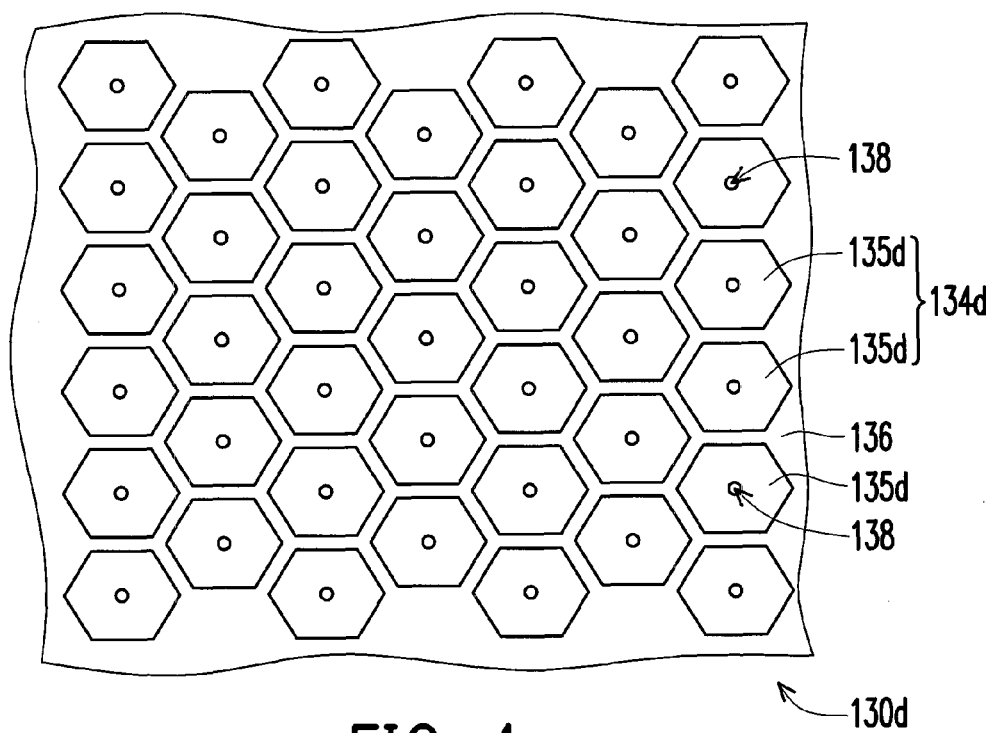
FIG. 4 is a schematic bottom view of a filter circuit board according to another embodiment of the present invention.

FIG. 4 is a schematic bottom view of a filter circuit board according to another embodiment of the present invention. Referring to FIG. 4, a filter circuit board 130d of this embodiment is similar to the filter circuit board 130a in FIG. 1B, and the main difference of the two merely lies in that, the shape of conductive patterns 135d of an electromagnetic band gap structure layer 134d in this embodiment is hexagonal.

It should be noted that, the present invention does not limit the shape of the conductive patterns 135a, 135b, 135c and 135d. The shape of the foregoing conductive patterns 135a, 135b and 135c is specified to be rectangular, and the shape of the conductive patterns 135d is specified to be hexagonal. However, in other embodiments not shown, in spite of the specific shape of the conductive patterns which may be circular or polygonal, the conductive patterns belong to a technical solution applicable to the present invention without departing from the protection scope of the present invention, provided that the conductive patterns are arranged in the same pitches.

Figure 5:
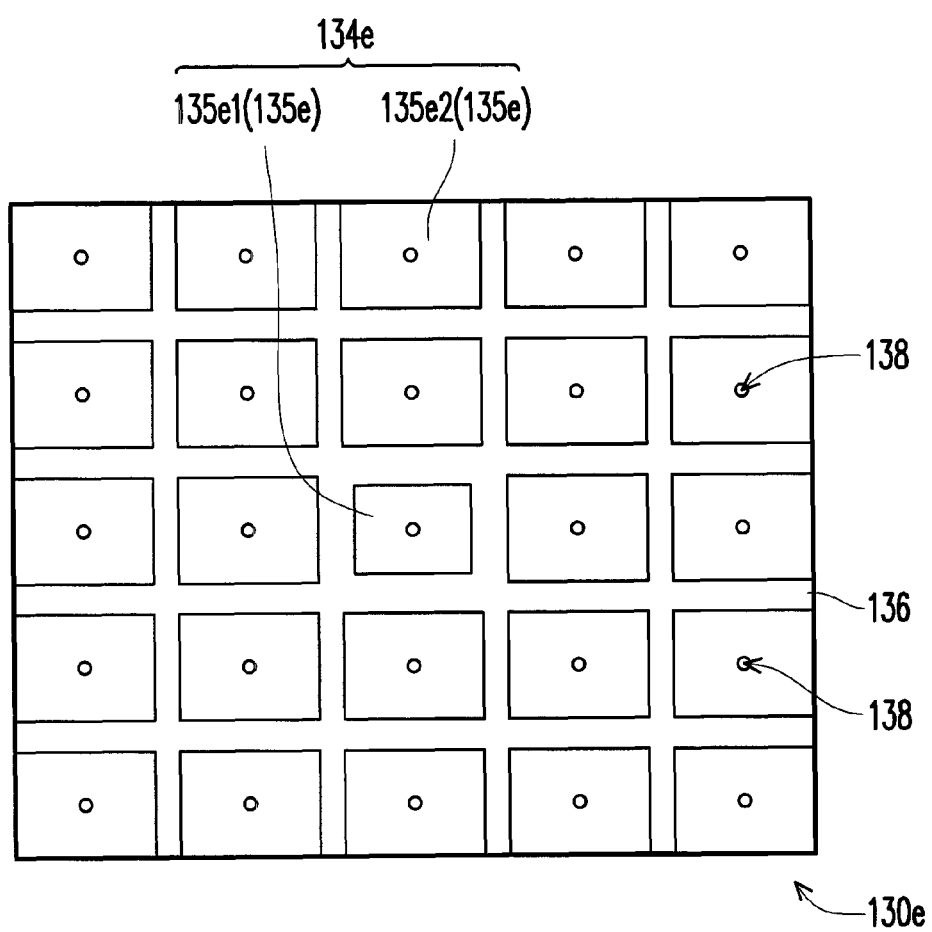
FIG. 5 is a schematic bottom view of a filter circuit board according to still another embodiment of the present invention.

FIG. 5 is a schematic bottom view of a filter circuit board according to still another embodiment of the present invention. Referring to FIG. 5, a filter circuit board 130e of this embodiment is similar to the filter circuit board 130a in FIG. 1B, and the main difference of the two merely lies in that, conductive patterns 135e of an electromagnetic band gap structure layer 134e have different sizes, and the central points of the conductive patterns 135e are arranged in the same pitches. Here, the size of the central position of the electromagnetic band gap structure layer 134e for installing a conductive pattern 135e1 of the heat generating element 110 is smaller than the size of a conductive pattern 135e2 on the periphery thereof. Since the conductive pattern 135e1 and the conductive pattern 135e2 have different sizes, the conductive pattern 135e1 and the conductive pattern 135e2 may respectively inhibit electromagnetic waves in different frequency bands. Persons skilled in the art may design appropriate sizes for the conductive patterns 135e1 and 135e2 according to actual requirements, so as to achieve a required technical effect.

Apart from this, the present invention does not limit the form of the filter circuit boards 130a, 130b, 130c, 130d and 130e. The foregoing filter circuit boards 130a, 130b, 130c, 130d and 130e are specified to be double sided filter circuit boards, and may inhibit electromagnetic wave noises in a specific frequency range. However, in other embodiments not shown, the filter circuit board may be a multi-layer filter circuit board. The multi-layer filter circuit board may be connected to a metal layer and corresponding conductive patterns through thermal vias. The multi-layer filter circuit board may inhibit electromagnetic wave noises in different specific frequency ranges at the same time due to the fact that the conductive patterns in each layer have different sizes. The aforementioned filter circuit board belongs to a technical solution applicable to the present invention without departing from the protection scope of the present invention.

Based on the above, in the present invention, a filter circuit board having an electromagnetic band gap structure layer is disposed between a heat generating element and a heat dissipation fin set. Thereby, the electromagnetic coupling effect between the heat generating element and the heat dissipation fin set is effectively lowered, noises are inhibited from being coupled to the heat dissipation fin set, and electromagnetic radiations generated by the heat dissipation fin set are reduced. Additionally, the original heat dissipation effect of the heat dissipation fin set for the heat generating element is not affected. Therefore, the electronic assembly of the present invention achieves a good heat dissipation effect, and the electromagnetic interference is effectively lowered.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic assembly, comprising:
a heat generating element;
a heat dissipation fin set, disposed on the heat generating element; and
a filter circuit board, disposed between the heat generating element and the heat dissipation fin set,
wherein the filter circuit board comprises:
a metal layer, wherein the heat dissipation fin set directly contacts the metal layer of the filter circuit board;
an electromagnetic band gap structure layer, comprising a plurality of conductive patterns arranged in the same pitches, wherein the heat generating element directly contacts at least one of the conductive patterns;
an insulation layer, disposed between the metal layer and the electromagnetic band gap structure layer; and
a plurality of first thermal vias, passing through the insulation layer, the metal layer and the conductive patterns of the electromagnetic band gap structure layer, wherein two ends of each of the first thermal vias respectively connect the metal layer and a corresponding conductive pattern of the plurality of conductive patterns.

2. The electronic assembly according to claim 1, wherein the heat generating element comprises a chip.

3. The electronic assembly according to claim 1, wherein the insulation layer comprises an upper surface and a lower surface opposite to each other, the metal layer completely covers the upper surface, and the conductive patterns of the electromagnetic band gap structure layer expose a part of the lower surface.

4. The electronic assembly according to claim 3, wherein the conductive patterns are embedded in the lower surface of the insulation layer, and a surface of each of the conductive patterns is aligned with the lower surface of the insulation layer.

5. The electronic assembly according to claim 3, wherein the conductive patterns are located on the lower surface of the insulation layer.

6. The electronic assembly according to claim 1, further comprising a plurality of second thermal vias, passing through the insulation layer, the metal layer and the conductive patterns directly contacting the heat generating element, wherein the second thermal vias connect the metal layer and the conductive patterns directly contacting the heat generating element.

7. The electronic assembly according to claim 1, wherein a shape of the conductive patterns is rectangular, hexagonal, or circular.

8. The electronic assembly according to claim 1, wherein the electromagnetic band gap structure layer is doped with ferromagnetic powders or ferroelectric substances.

9. The electronic assembly according to claim 1, wherein a material of the conductive patterns comprises metal.

10. The electronic assembly according to claim 1, wherein a material of the insulation layer comprises ceramics.

* * * * *